US006535567B1

United States Patent
Girardeau, Jr.

(10) Patent No.: US 6,535,567 B1
(45) Date of Patent: Mar. 18, 2003

(54) METHOD AND APPARATUS FOR SUPPRESSION OF JITTER IN DATA TRANSMISSION SYSTEMS

(75) Inventor: James Ward Girardeau, Jr., Sacramento, CA (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/454,373

(22) Filed: Dec. 3, 1999

Related U.S. Application Data

(60) Provisional application No. 60/110,725, filed on Dec. 3, 1998.

(51) Int. Cl.[7] .................................................. H04L 7/00
(52) U.S. Cl. ........................ 375/372; 375/373; 370/516
(58) Field of Search .................................. 375/371, 373, 375/375, 376, 327, 372; 327/147, 156; 370/476, 474, 516, 519

(56) References Cited

U.S. PATENT DOCUMENTS

| | | | |
|---|---|---|---|
| 5,159,291 A | | 10/1992 | Ghoshal |
| 5,493,243 A | | 2/1996 | Ghoshal |
| 5,539,785 A | | 7/1996 | Burch et al. |
| 5,796,786 A | * | 8/1998 | Lee ........................... 329/304 |
| 5,940,450 A | * | 8/1999 | Koslov et al. ............... 375/326 |
| 6,028,642 A | * | 2/2000 | Rinaldi et al. .............. 348/531 |
| 6,272,138 B1 | * | 8/2001 | Weon .......................... 348/497 |
| 6,295,325 B1 | * | 9/2001 | Farrow et al. ............... 375/327 |
| 6,324,235 B1 | * | 11/2001 | Savell et al. ................. 375/372 |

OTHER PUBLICATIONS

Abeysekera, S. et al., "A Comprehensive Analysis of Stuff Threshold Modulation Used in Clock–Rate Adaptation Schemes", *IEEE Transactions on Communications*, vol. 46, No. 8, pp. 1088–1096 (Aug. 1998).

Abeysekera, S., "Optimum Stuff Threshold Modulation Schemes for Digital Data Transmission", *IEEE Transactions on Communications*, pp. IV–169–IV172 (1994).

Abeysekera, S. et al., "The Impact of Differential 'Phase' Measurement on the Characteristics of Waiting Time Jitter", *IEEE Transactions on Communications*, pp. 661–666 (1994).

Klein, M. et al., "SONET/SDH Pointer Processor Implementations", pp. 655–660 (no date).

Kusyk, R. et al., "Analysis of Techniques for the Reduction of Jitter Caused by SONET Pointer Adjustments", *IEEE Transactions on Communications*, vol. 42, No. 2/3/4, pp. 2036–2050 (Feb./Mar./Apr. 1994).

Kusyk, R. et al., "Spectral Analysis of Waiting Time Jitter in the Presence of Stuff Threshold Modulation", Alberta Telecommunications Research Centre, Edmonton, Alberta, Canada, 3 pages (Feb. 22, 1990).

Pierobon, G. et al., "Jitter Analysis of a Double Modulated Threshold Pulse Stuffing Synchronizer", *IEEE Transactions on Communications*, vol. 39, No. 4, pp. 594–602 (Apr. 1991).

* cited by examiner

*Primary Examiner*—Amanda T. Le
(74) *Attorney, Agent, or Firm*—Merchant & Gould P.C.

(57) ABSTRACT

A jitter suppression apparatus in a data transmission system includes a phase detector circuit to determine a plurality of phase errors between sync pulses of a data line and sync pulses of a reference line, and an adapted phase error offset circuit, coupled to the phase detector circuit, to generate a plurality of phase error offsets and adaptively offset the plurality of phase error offsets. The jitter suppression apparatus may also include a stuff/delete slicer, coupled to the adapted phase error offset circuit, to generate a plurality of stuff/delete signals such that a framer can determine what type of data frames to send to a communication channel of the data transmission system. A jitter suppression method includes steps of detecting a phase error, computing a phase error offset, and filtering out the phase error offset. An integrator may be used to filter out the phase error offset input to the stuff/delete slicer.

25 Claims, 4 Drawing Sheets

METHOD AND APPARATUS FOR SUPPRESSION OF JITTER IN DATA TRANSMISSION SYSTEMS

RELATED APPLICATIONS

This application claims the benefit of Provisional Application, U.S. Ser. No. 60/110,725, filed on Dec. 3, 1998, entitled to "METHOD AND APPARATUS FOR SUPPRESSION OF JITTER IN DATA TRANSMISSION SYSTEMS", by James Ward Girardeau, Jr.

BACKGROUND OF THE INVENTION

1. Field of the Invention

This invention relates in general to data communication systems, and more particularly, to a method and apparatus for suppression of jitter in data communication systems.

2. Description of Related Art

Waiting time jitter, or low frequency jitter, or wander, is well known phenomenon in data transmission systems. Generally, low frequency jitter occurs in pulse-stuff modulated digital circuits. Pulse-stuff modulation has been used to maintain synchronization in data communication systems which selectively insert pulses into a digital data frame. The output of a pulse-stuff modulation often contains low frequency jitter. The detailed description of this type of low frequency jitter can be found in the following references: 1) U.S. Pat. No. 5,539,785, entitled "JITTER/WANDER REDUCTION CIRCUIT FOR PULSE-STUFFED, SYNCHRONIZED DIGITAL COMMUNICATION," issued to Burch et al., on Jul. 23, 1996; 2) an article, entitled "A COMPREHENSIVE ANALYSIS OF STUFF THRESHOLD MODULATION USED IN CLOCK-RATE ADAPTION SCHEMES," authored by Saman S. Abeysekera et al., published by IEEE Trans. On Communications, vol. 46, no. 8, August 1998; 3) an article, entitled "ANALYSIS OF TECHNIQUES FOR THE REDUCTION OF JITTER CAUSED BY SONET POINTER ADJUSTMENTS", authored by Richard G. Kusyk, et al., published by IEEE Trans. On Communications, vol. 42, no. 2/3/4, February/March/April 1994; and 4) an article, entitled "JITTER ANALYSIS OF A DOUBLE MODULATED THRESHOLD PULSE STUFFING SYNCHRONIZER," authored by Gianfranco L. Pierobon, et al., published by IEEE Trans. On Communications, vol. 39, no. 4, April 1991.

Techniques for reducing low frequency jitter are discussed in two of the above references: 1) U.S. Pat. No. 5,539,785; and 2) the article by Saman S. Abeysekera et al.

However, the technique discussed in U.S. Pat. No. 5,539,785 requires special hardware and non-standard methods for reducing the jitter. The technique requires coordination between a transmitter and a receiver, i.e. both sides of a data communication channel. The technique discussed in the article by Saman S. Abeysekera et al. shows an improved method called a "threshold modulated stuffing method". This method eliminates low frequency jitter at a transmitter and does not require interaction between a transmitter and a receiver, i.e. the jitter is eliminated at the transmitter and is not seen at the receiver. However, the "threshold modulated stuffing" method does not provide a good jitter suppression over wider operating limits as shown in FIG. 4.

Typically, in a data communication system, a transmit data rate may be different from a receive data rate. The transmit data is assembled into a transmit frame that carries the transmit data and the other overhead bits as needed in the system, for example, for maintenance, signaling, synchronization, etc. A frame generally has a variable length. For example, a frame may be a "short" frame with a nominal frame size minus a variable, e.g. delta, or a frame may be a "long" frame with a nominal frame size plus a variable, e.g. delta. This may vary from system to system. For example, another system may have three frame sizes: a nominal frame size, a "short" frame size, and a "long" frame size. Generally, a framer decides what type of frame to send at a transmitter depending on the level of a transmit data buffer. For instant, if the buffer tends to be over-filling, indicating that the transmit data is arriving slightly faster than the outgoing frame rate, then the framer would tend to send more "short" frames than "long" frames, thereby effectively speeding up the communication channel data rate slightly and thus emptying the buffer. Likewise, if the buffer tends to be under-filling, indicating that the transmit data is arriving slightly slower than the outgoing frame rate, then the framer would tend to send more "long" frames than "short" frames, thereby effectively slowing down the communication channel data rate slightly and allowing the transmit data buffer to re-fill.

In a "nominal" case where the transmit rate is exactly matched to a nominal transmission rate, the framer may send alternating "short" and "long" frames. Alternatively, in a system that could transmit frames with nominal frame lengths, then the framer may send frames with nominal frame lengths. However, if a very slight frequency offset is present between the transmit data rate and the nominal transmission rate, then after some arbitrarily long period of time (depending on the frequency offset), the framer would inject an additional "short" or "long" frame into the alternating long/short pattern. This extra injection occurs at a steady rate, thereby resulting in a very low frequency jitter.

In another case, for instance, if the nominal transmission rate happens to be exactly at some ratio of long/short frame patterns, then the framer may send a fixed pattern of, e.g. long long short . . . long long short . . . over and over. However, if the nominal transmission rate is very near the ratio, but not exactly at the ratio, then occasionally the framer injects an additional "long" or "short" frame, thereby causing a very low frequency jitter.

In the existing systems, threshold modulated stuff/delete scheme was proposed to randomize the threshold modulation with some type of pattern, with the desired result that the pattern will modulate the lower frequency jitter to a higher frequency jitter that can be removed readily at a later point by a low pass filter. However, this threshold modulation is not reliable as jitter patterns can always be found that can defeat a modulation waveform.

It is with respect to these and other considerations that the present invention has been made.

SUMMARY OF THE INVENTION

In accordance with the present invention, the above and other problems are solved by providing a jitter suppression circuit to suppress or eliminate waiting time jitter or low frequency jitter at a transmitter end of a data transmission system.

In one embodiment of the present invention, a jitter suppression circuit in a data transmission system includes a phase detector circuit to determine a plurality of phase errors between sync pulses of a Digital Subscribe Line (DSL) and sync pulses of a reference line; and an adapted phase error offset circuit, coupled to the phase detector circuit, to generate a plurality of phase error offsets and adaptively offset the plurality of phase error offsets.

Further in one embodiment of the present invention, a jitter suppression method includes steps of detecting a phase error, computing a phase error offset, and filtering out the phase error offset.

Accordingly, the present invention allows the phase errors between the sync pulses of a Digital Subscriber Line (DSL) and the sync pulses of a reference line to be filtered out before inputting to a stuff/delete slicer which generates a plurality of stuff/delete signals for a framer. Waiting time jitter or low frequency jitter is thus eliminated and/or suppressed. The framer can utilize the stuff/delete signals to determine what type of data frames to send to a communication channel of the data transmission system.

These and various other features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

The present invention provides a jitter suppression circuit to suppress or eliminate waiting time jitter or low frequency jitter at a transmitter end of a data transmission system.

Before describing in detail a particular embodiment of a jitter suppression apparatus and method in accordance with the present invention, it should be understood that other embodiments may be utilized as structural changes may be made without departing from the scope of the present invention, and that the present invention resides primarily in a novel structural combination of conventional signal processing and communication circuits and components and not in the particular detailed configurations thereof. Accordingly, the structure, arrangement, and control of these conventional circuits and components have been illustrated in drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the figures do not necessarily represent the electrical or mechanical structural arrangement of an exemplary system or circuitry, but are primarily intended to illustrate the major structural components of the system or circuitry in a convenient functional group, so that the present invention may be more readily understood.

Figure 1:
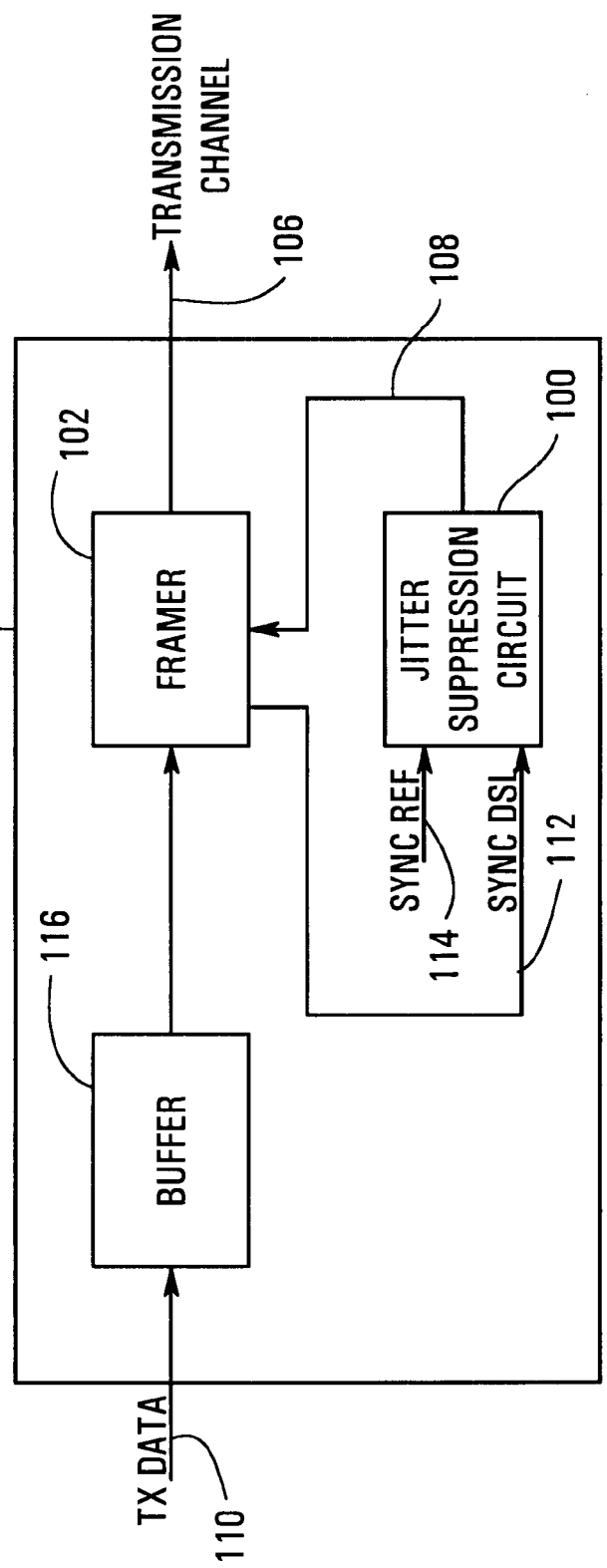
FIG. 1 is a block diagram of one embodiment of a transmitter having a jitter suppression circuit in accordance with the principles of the present invention.

In FIG. 1, a jitter suppression circuit 100 in accordance with the principles of the present invention is coupled to a framer 102 in a transmitter 104. The framer 102 selects what type of data frames to send to a transmission channel 106 based on a control signal 108, e.g. a stuff/delete signal, generated from the jitter suppression circuit 100. The framer 102 provides sync pulses of transmit (TX) data 110 of a Digital Subscriber Line (DSL) 112 to the jitter suppression circuit 100. It is appreciated that the sync pulses of TX data can be fed into the jitter suppression circuit 100 from other suitable sources. Sync pulses from a reference transmit data line 114 are also provided to the jitter suppression circuit 100. The transmitter 104 may also include a data buffer 116 to store the TX data 110. It is appreciated that the transmitter 104 may be implemented as a part of a transceiver in a data communication system.

Figure 2:
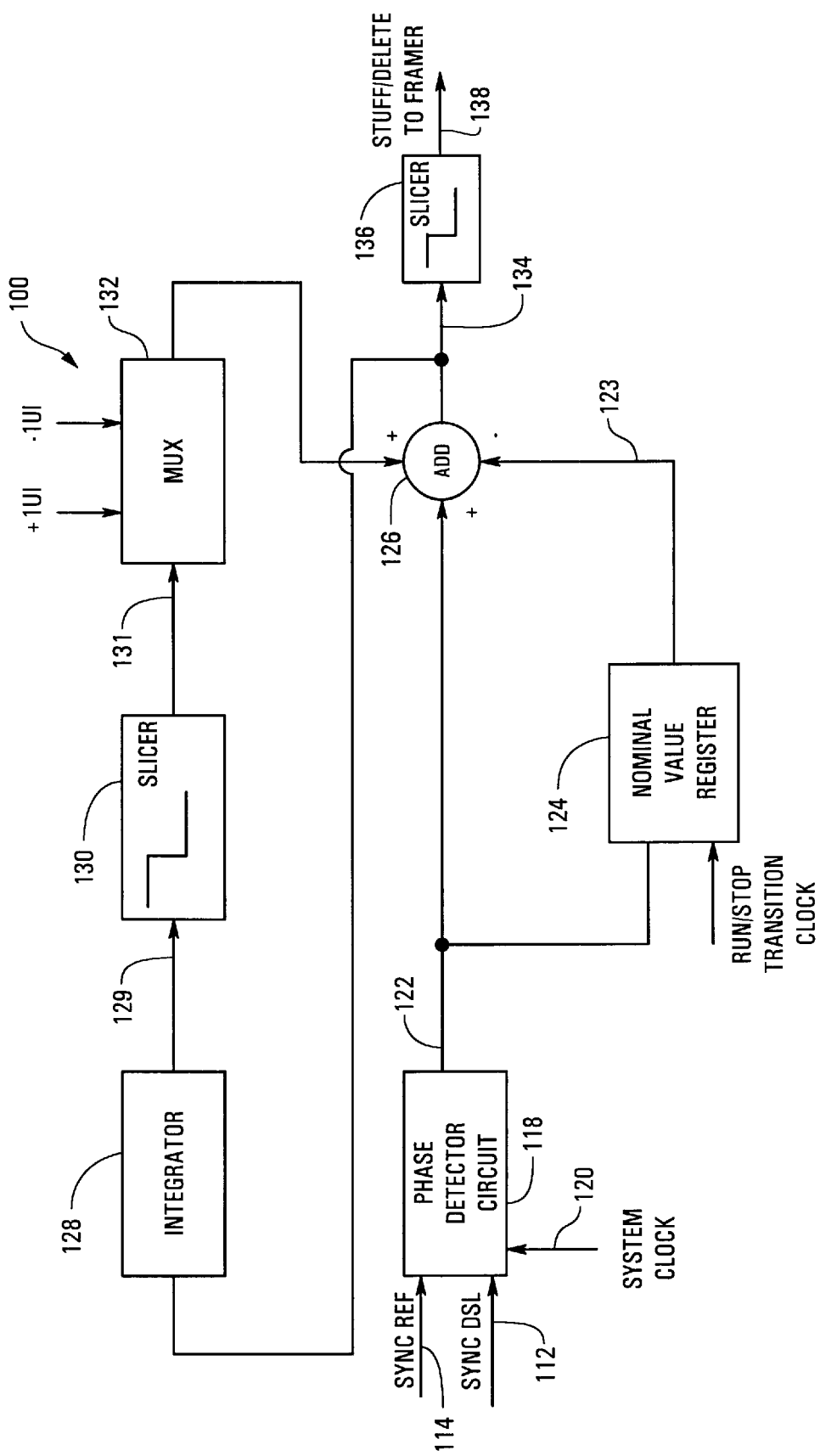
FIG. 2 is a block diagram of one embodiment of a jitter suppression circuit in accordance with the principles of the present invention.

In FIG. 2, the jitter suppression circuit 100 includes a phase detector circuit 118 which is clocked by a system clock 120. In a clock cycle, the phase detector circuit 118 compares and determines a phase difference or phase error between a sync pulse of the Digital Subscriber Line (DSL) 112 and a sync pulse of a reference line (REF) 114. The sync pulse of the DSL 112, typically 6 ms (millisecond), is compared to the sync pulse of the REF line, typically 8 kHz which can be divided by 48 to generate a 6 ms reference sync pulse. The two sync pulses are compared to generate a phase error 122 and outputted from the phase detector circuit 118. On power up or start of data transmission, a nominal value for the phase error is stored in a register 124. The stored nominal value is typically in units of system clocks. It is appreciated that other representation of the nominal value for the phase error can be used within the scope of the present invention. The value of a phase error represents the difference between the REF sync pulse (divided by 48) and the DSL sync pulse.

The phase detector circuit 118 preferably utilizes a high speed system clock 120 to directly measure the difference between the two syncs pulses (REF and DSL). This allows for very accurate measurements of phase errors, with arbitrary accuracy depending on the frequency of the system clock. The use of a system clock in the phase error measurements is superior to the existing methods which rely on buffer fullness indicators.

As also shown in FIG. 2, the phase error 122 and a nominal value 123 of the phase error are summed in an adder 126. The phase error 122 is subtracted from the nominal value 123 outputted from the register 124 at the adder 126 to generate a phase error offset to be fed into an integrator 128, a slicer 130, and a feedback mux 132. In one embodiment, at each 6 ms sync period, the phase error 122 is calculated by the phase detector circuit 118 and summed together with the nominal value 123 and the output of the feedback mux 132. The output of this sum is filtered by the integrator 128. An output 129 of the integrator 128 is sliced (positive or negative) at the slicer 130, with a sliced output 131 being used to drive the feedback mux 132 that selects one of two offset values, +1 UI (Unit Interval), −1 UI (Unit Interval). If the sliced output 131 is positive, the −1 UI offset value is selected and outputted to the adder 126, thereby driving the integrator 128 toward negative. If the sliced output 131 is negative, the +1 UI offset value is selected and outputted to the adder 126, thereby driving the integrator 128 toward positive. An output 134 of the adder 126 is sent to a stuff/delete slicer 136. The stuff/delete slicer 136 generates stuff/delete control signals 138 for the framer 102.

Figure 3:
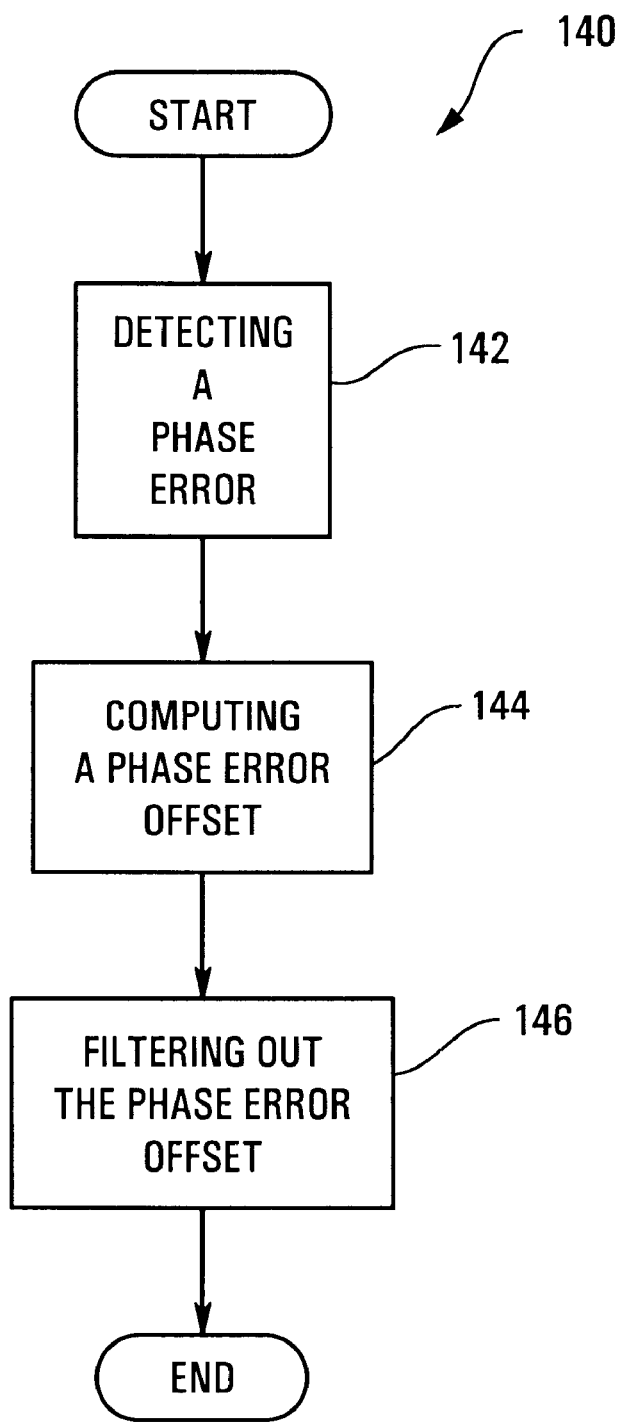
FIG. 3 is an operational flow diagram illustrating a jitter suppression method in accordance with the principles of the present invention.

In FIG. 3, an operational flow 140 of jitter suppression operations in accordance with the principles of the present invention is illustrated. The operational flow 140 starts with an operation 142 of detecting a phase error. A phase error offset is then computed in an operation 144. Finally, the phase error offset is filtered out in an operation 146. The phase error offset is filtered out by adaptive filtering.

Figure 4:
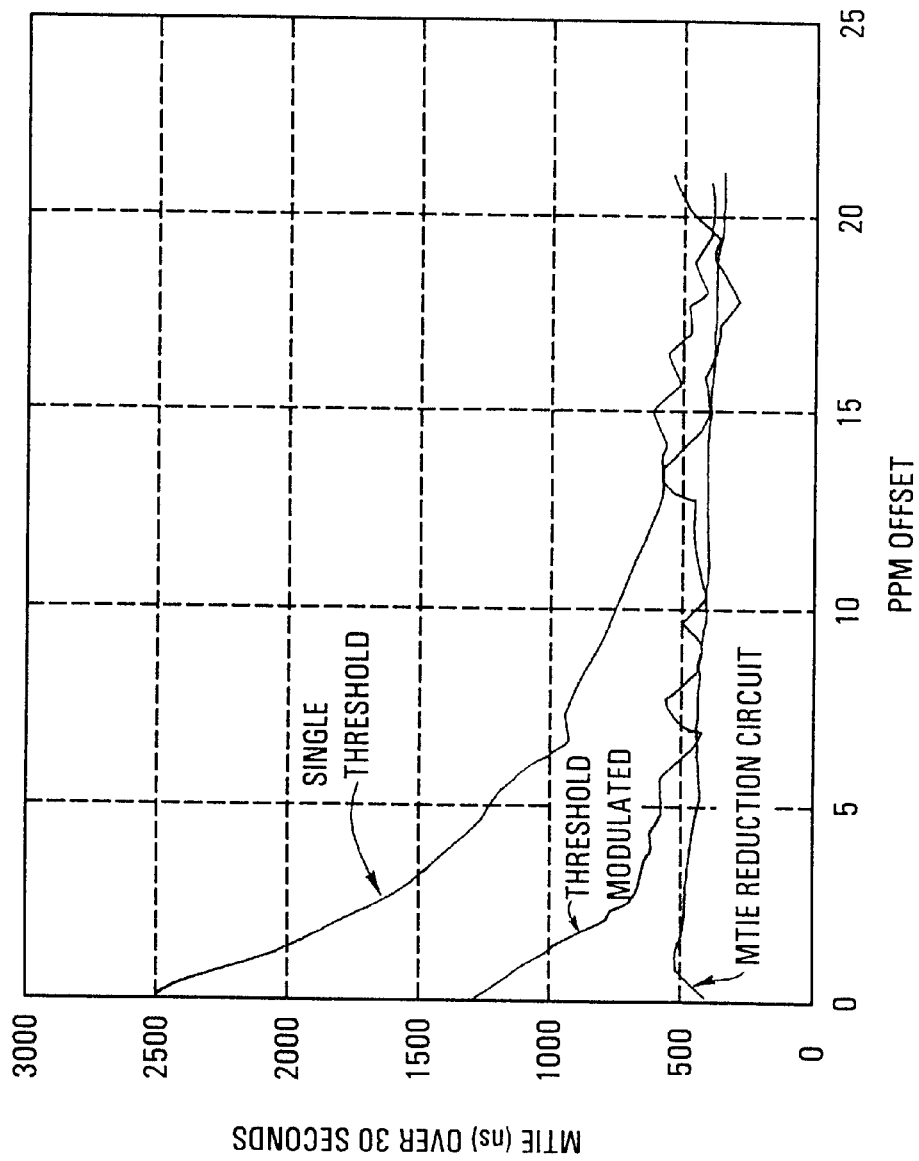
FIG. 4 illustrates a comparison in jitter reduction/suppression performance for two existing jitter reduction techniques and the jitter suppression technique in accordance with the principles of the present invention.

FIG. 4 illustrates a comparison in jitter reduction/suppression performance for two existing jitter reduction techniques and the jitter suppression technique in accordance with the principles of the present invention. It is shown that the jitter suppression performance using the jitter suppression technique in accordance with the principles of the present invention, e.g. a MTIE (Maximum Time Interval Error) reduction circuit, is much better than those using a threshold modulated method and using a single threshold method in the prior art. For example, the jitter suppression technique in accordance with the principles of the present invention provides much better jitter suppression over a much wider operating limits than the existing techniques.

It is appreciated to a person skilled in the art that the jitter suppression circuit in accordance with the present invention can be implemented in a transceiver or a functionally equivalent circuitry. It is also appreciated that the jitter suppression method in accordance with the present invention can be implemented in a computer-readable medium containing instructions for a computer process causing a computer system to suppress waiting time jitter of a data transmission system.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A jitter suppression apparatus in a data transmission system, comprising:
    a phase detector circuit to determine a plurality of phase errors between sync pulses of a data line and sync pulses of a reference line;
    an adapted phase error offset circuit, coupled to the phase detector circuit, to generate a plurality of phase error offsets and adaptively offset the plurality of phase error offsets; and
    a stuff/delete slicer, coupled to an output of the adapted phase error offset circuit and coupled to a framer of the data transmission system, to generate a plurality of stuff/delete signals such that the framer can determine what type of data frames to send to a communication channel of the data transmission system.

2. The apparatus of claim 1, wherein the adapted phase error offset circuit comprises:
    a register to store a nominal value of one of the plurality of phase errors;
    an adder being coupled to the phase detector circuit, the register, and the stuff/delete slicer;
    an integrator to integrate an output of the adder;
    an integrated phase error offset slicer, coupled to an output of the integrator, to generate a control signal; and
    a mux, coupled to an output of the integrated phase error offset slicer and controlled by the control signal, to select one of a plurality of predetermined offset values.

3. The apparatus of claim 2, wherein the adder comprises:
    at least three inputs, a first input being coupled to an output of the phase detector circuit, a second input being coupled to an output of the register, and a third input being coupled to an output of the mux, wherein the first input of the adder is subtracted from the second input of the adder; and
    at least one output being coupled to the stuff/delete slicer.

4. The apparatus of claim 3, wherein the plurality of predetermined values include a positive offset value and a negative offset value, when the control signal is negative, the mux selects and outputs the positive offset value, and when the control signal is positive, the mux selects and outputs the negative offset value.

5. The apparatus of claim 4, wherein the phase detector circuit is operated under a system clock to measure the phase errors.

6. The apparatus of claim 1, wherein the adapted phase error offset circuit comprises:
    a register to store a nominal value of one of the plurality of phase errors;
    an adder being coupled to the phase detector circuit, the register, and the stuff/delete slicer;
    an integrator to integrate an output of the adder;
    an integrated phase error offset slicer, coupled to an output of the integrator, to generate a control signal; and
    a mux, coupled to an output of the integrated phase error offset slicer and controlled by the control signal, to select one of a plurality of predetermined offset values.

7. The apparatus of claim 6, wherein the adder comprises:
    at least three inputs, a first input being coupled to an output of the phase detector circuit, a second input being coupled to an output of the register, and a third input being coupled to an output of the mux, wherein the first input of the adder is subtracted from the second input of the adder; and
    at least one output to output an added value of the at least three inputs.

8. The apparatus of claim 7, wherein the plurality of predetermined values include a positive offset value and a negative offset value, when the control signal is negative, the mux selects and outputs the positive offset value, and when the control signal is positive, the mux selects and outputs the negative offset value.

9. The apparatus of claim 8, wherein the phase detector circuit is operated under a system clock to measure the phase errors.

10. The apparatus of claim 1, wherein the phase detector circuit is operated under a system clock to measure the phase errors.

11. A data communication system, comprising:
    a transmitter to transmit data;
    a receiver to receive transmitted data;
    a data communication channel to send the data from the transmitter to the receiver;
    wherein the transmitter comprises:
        a buffer to store frames of the data to be transmitted;
        a framer to send the frames of the data to the data communication channel with a synchronized transmit data rate;
        a jitter suppression apparatus comprising:
            a phase detector circuit to determine a plurality of phase errors between sync pulses of a data line and sync pulses of a reference line; and
            an adapted phase error offset circuit, coupled to the phase detector circuit, to generate a plurality of phase error offsets and adaptively offset the plurality of phase error offsets.

12. The system of claim 11, further comprising a stuff/delete slicer, coupled to the adapted phase error offset circuit, to generate a plurality of stuff/delete signals such that a framer can determine what type of data frames to send to the data communication channel.

13. The system of claim 12, wherein the adapted phase error offset circuit comprises:
- a register to store a nominal value of one of the plurality of phase errors;
- an adder being coupled to the phase detector circuit, the register, and the stuff/delete slicer;
- an integrator to integrate an output of the adder;
- an integrated phase error offset slicer, coupled to an output of the integrator, to generate a control signal; and
- a mux, coupled to an output of the integrated phase error offset slicer and controlled by the control signal, to select one of a plurality of predetermined offset values.

14. The system of claim 13, wherein the adder comprises:
- at least three inputs, a first input being coupled to an output of the phase detector circuit, a second input being coupled to an output of the register, and a third input being coupled to an output of the mux, wherein the first input of the adder is subtracted from the second input of the adder; and
- at least one output being coupled to the stuff/delete slicer.

15. The system of claim 14, wherein the plurality of predetermined values include a positive offset value and a negative offset value, when the control signal is negative, the mux selects and outputs the positive offset value, and when the control signal is positive, the mux selects and outputs the negative offset value.

16. The system of claim 11, wherein the phase detector circuit is operated under a system clock to measure the phase errors.

17. A jitter suppression apparatus in a data transmission system, comprising:
- a phase detector circuit to determine a plurality of phase errors between sync pulses of a data line and sync pulses of a reference line;
- an adapted phase error offset circuit, coupled to the phase detector circuit, to generate a plurality of phase error offsets and adaptively offset the plurality of phase error offsets, the adapted phase error offset circuit comprising:
  - a register to store a nominal value of one of the plurality of phase errors;
  - an adder being coupled to the phase detector circuit, the register, and the stuff/delete slicer;
  - an integrator to integrate an output of the adder;
  - an integrated phase error offset slicer, coupled to an output of the integrator, to generate a control signal; and
  - a mux, coupled to an output of the integrated phase error offset slicer and controlled by the control signal, to select one of a plurality of predetermined offset values; and
- a stuff/delete slicer, coupled to the adapted phase error offset circuit, to generate a plurality of stuff/delete signals such that a framer can determine what type of data frames to send to a communication channel of the data transmission system.

18. A jitter suppression apparatus in a data transmission system, comprising:
- a phase detector circuit to determine a plurality of phase errors between sync pulses of a data line and sync pulses of a reference line; and
- an adapted phase error offset circuit, coupled to the phase detector circuit, to generate a plurality of phase error offsets and adaptively offset the plurality of phase error offsets, the adapted phase error offset circuit comprising:
  - a register to store a nominal value of one of the plurality of phase errors;
  - an adder being coupled to the phase detector circuit, the register, and the stuff/delete slicer;
  - an integrator to integrate an output of the adder;
  - an integrated phase error offset slicer, coupled to an output of the integrator, to generate a control signal; and
  - a mux, coupled to an output of the integrated phase error offset slicer and controlled by the control signal, to select one of a plurality of predetermined offset values.

19. The apparatus of claim 18, wherein the adder comprises:
- at least three inputs, a first input being coupled to an output of the phase detector circuit, a second input being coupled to an output of the register, and a third input being coupled to an output of the mux, wherein the first input of the adder is subtracted from the second input of the adder; and
- at least one output to output an added value of the at least three inputs.

20. The apparatus of claim 19, wherein the plurality of predetermined values include a positive offset value and a negative offset value, when the control signal is negative, the mux selects and outputs the positive offset value, and when the control signal is positive, the mux selects and outputs the negative offset value.

21. The apparatus of claim 18, wherein the phase detector circuit is operated under a system clock to measure the phase errors.

22. A data communication system, comprising:
- a transmitter to transmit data;
- a receiver to receive transmitted data;
- a data communication channel to send the data from the transmitter to the receiver;
- wherein the transmitter comprises:
  - a buffer to store frames of the data to be transmitted;
  - a framer to send the frames of the data to the data communication channel with a synchronized transmit data rate;
  - a jitter suppression apparatus comprising:
    - a phase detector circuit to determine a plurality of phase errors between sync pulses of a data line and sync pulses of a reference line;
    - an adapted phase error offset circuit, coupled to the phase detector circuit, to generate a plurality of phase error offsets and adaptively offset the plurality of phase error offsets, the adapted phase error offset circuit comprising:
      - a register to store a nominal value of one of the plurality of phase errors;
      - an adder being coupled to the phase detector circuit, the register, and the stuff/delete slicer;
      - an integrator to integrate an output of the adder;
      - an integrated phase error offset slicer, coupled to an output of the integrator, to generate a control signal; and
      - a mux, coupled to an output of the integrated phase error offset slicer and controlled by the control signal, to select one of a plurality of predetermined offset values; and a stuff/delete slicer, coupled to the adapted phase error offset circuit, to generate a plurality of stuff/delete signals such that a framer can determine what type of data frames to send to the data communication channel.

23. The system of claim 22, wherein the adder comprises:

at least three inputs, a first input being coupled to an output of the phase detector circuit, a second input being coupled to an output of the register, and a third input being coupled to an output of the mux, wherein the first input of the adder is subtracted from the second input of the adder; and at least one output being coupled to the stuff/delete slicer.

24. The system of claim 23, wherein the plurality of predetermined values include a positive offset value and a negative offset value, when the control signal is negative, the mux selects and outputs the positive offset value, and when the control signal is positive, the mux selects and outputs the negative offset value.

25. A method of suppressing waiting time jitter, comprising: detecting a phase error;

adaptively computing a phase error offset; and adaptively filtering out the phase error offset;

wherein the steps of adaptively computing and adaptively filtering comprise the steps of:

integrating the phase error offset;

slicing the integrated phase error offset;

muxing a positive predetermined value and a negative predetermined value base on an output from slicing; and feeding back an output from muxing to filter out the phase error offset.

* * * * *